United States Patent
Mori et al.

(10) Patent No.: US 7,715,198 B2
(45) Date of Patent: May 11, 2010

(54) PACKAGE STRUCTURE OF INVERTER APPARATUS AND METHOD OF MANUFACTURING THE SAME

(75) Inventors: Kazuaki Mori, Kakogawa (JP); Makoto Takano, Suzuka (JP)

(73) Assignee: Fuji Electric FA Components & Systems Co., Ltd., Tokyo (JP)

( * ) Notice: Subject to any disclaimer, the term of this patent is extended or adjusted under 35 U.S.C. 154(b) by 182 days.

(21) Appl. No.: 11/798,820

(22) Filed: May 17, 2007

(65) Prior Publication Data

US 2007/0284418 A1      Dec. 13, 2007

(30) Foreign Application Priority Data

May 19, 2006   (JP)   .............................. 2006-140590

(51) Int. Cl.
  *H05K 5/00*   (2006.01)
  *A47F 7/00*   (2006.01)
  *A47B 81/00*  (2006.01)

(52) U.S. Cl. .................... 361/724; 361/752; 312/223.2; 211/26

(58) Field of Classification Search .............. 361/724, 361/752; 312/223.2; 211/26
  See application file for complete search history.

(56) References Cited

U.S. PATENT DOCUMENTS

| | | | | |
|---|---|---|---|---|
| 2,196,399 A | * | 4/1940 | Rubel | 220/4.01 |
| 3,307,894 A | * | 3/1967 | Collier | 312/265.2 |
| 3,353,854 A | * | 11/1967 | Hansen | 403/171 |
| 3,655,254 A | * | 4/1972 | Mayer et al. | 312/265.4 |
| 3,687,325 A | * | 8/1972 | Simons | 220/4.33 |
| 3,919,603 A | * | 11/1975 | Salvati et al. | 361/605 |
| 4,045,104 A | * | 8/1977 | Peterson | 312/265.4 |
| 4,102,554 A | * | 7/1978 | Reimer | 312/223.1 |
| 4,772,999 A | * | 9/1988 | Fiorina et al. | 363/141 |
| 4,814,942 A | * | 3/1989 | Robirds et al. | 361/607 |
| 4,869,380 A | * | 9/1989 | Metcalfe et al. | 211/189 |
| 4,997,240 A | * | 3/1991 | Schmalzl et al. | 312/265.4 |
| 5,022,863 A | * | 6/1991 | Keens et al. | 439/108 |
| 5,070,429 A | * | 12/1991 | Skirpan | 361/644 |
| 5,156,280 A | * | 10/1992 | Joist | 211/41.17 |
| 5,202,818 A | * | 4/1993 | Betsch et al. | 361/829 |
| 5,214,836 A | * | 6/1993 | Beals | 29/469.5 |
| 5,228,762 A | * | 7/1993 | Mascrier | 312/265.4 |
| 5,353,216 A | * | 10/1994 | Ayers et al. | 363/144 |
| 5,380,083 A | * | 1/1995 | Jones et al. | 312/265.3 |
| 5,497,289 A | * | 3/1996 | Sugishima et al. | 361/709 |
| 5,571,256 A | * | 11/1996 | Good et al. | 211/26 |
| 5,590,938 A | * | 1/1997 | De Andrea | 312/257.1 |
| 5,639,150 A | * | 6/1997 | Anderson et al. | 312/265.3 |

(Continued)

FOREIGN PATENT DOCUMENTS

EP        508002 A1  *  10/1992

(Continued)

*Primary Examiner*—Jayprakash N Gandhi
*Assistant Examiner*—Bradley H Thomas
(74) *Attorney, Agent, or Firm*—Manabu Kanesaka

(57) ABSTRACT

A package structure of an inverter apparatus includes at least four metal column supports arranged vertically to be spaced apart from each other, and sheet-metal bent beams connecting the column supports in transverse direction and longitudinal direction to form rectangular package structure. The metal column support is an aluminum die-cast support, and the sheet-metal bent beam has a U-shape with sharp edges in cross section.

3 Claims, 7 Drawing Sheets

U.S. PATENT DOCUMENTS

| | | | | |
|---|---|---|---|---|
| 5,749,476 A * | 5/1998 | Besserer et al. | | 211/26 |
| 5,791,498 A * | 8/1998 | Mills | | 211/26 |
| 5,806,945 A * | 9/1998 | Anderson et al. | | 312/265.3 |
| 5,938,302 A * | 8/1999 | Anderson et al. | | 312/223.1 |
| 5,941,621 A * | 8/1999 | Boulay et al. | | 312/334.4 |
| 5,997,117 A * | 12/1999 | Krietzman | | 312/265.4 |
| 6,012,791 A * | 1/2000 | Benner et al. | | 312/265.2 |
| 6,019,446 A * | 2/2000 | Laboch et al. | | 312/265.1 |
| 6,021,909 A * | 2/2000 | Tang et al. | | 211/183 |
| 6,039,420 A * | 3/2000 | Besserer et al. | | 312/265.1 |
| 6,070,957 A * | 6/2000 | Zachrai | | 312/334.4 |
| 6,145,943 A * | 11/2000 | Reuter et al. | | 312/223.1 |
| 6,254,207 B1 * | 7/2001 | Leneutre | | 312/263 |
| 6,299,268 B1 * | 10/2001 | Carle et al. | | 312/265.4 |
| 6,305,556 B1 * | 10/2001 | Mayer | | 211/26 |
| 6,320,776 B1 * | 11/2001 | Kajiura et al. | | 363/141 |
| 6,421,215 B1 * | 7/2002 | Bushue | | 361/93.1 |
| 6,424,534 B1 * | 7/2002 | Mayer et al. | | 361/724 |
| 6,578,939 B1 * | 6/2003 | Mayer | | 312/334.5 |
| 6,591,997 B2 * | 7/2003 | Hung | | 211/183 |
| 6,600,656 B1 * | 7/2003 | Mori et al. | | 361/724 |
| 6,622,873 B2 * | 9/2003 | Hegrenes et al. | | 211/26 |
| 6,657,320 B1 * | 12/2003 | Andrews et al. | | 307/64 |
| 6,698,079 B1 * | 3/2004 | Mimlitch et al. | | 29/462 |
| 6,863,188 B2 * | 3/2005 | Besserer et al. | | 211/183 |
| 6,930,886 B2 * | 8/2005 | Velez et al. | | 361/727 |
| 2004/0016713 A1 * | 1/2004 | Wyatt et al. | | 211/183 |
| 2005/0162838 A1 * | 7/2005 | Mayer | | 361/725 |

FOREIGN PATENT DOCUMENTS

JP    2005/243741    9/2005

* cited by examiner

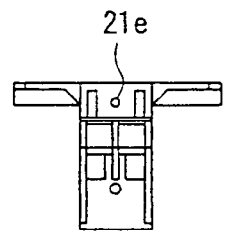
Fig. 5(b)
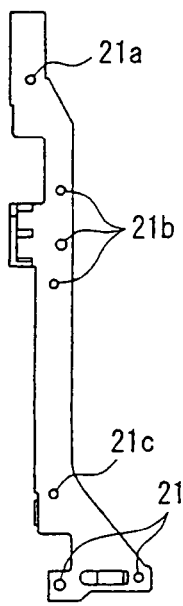 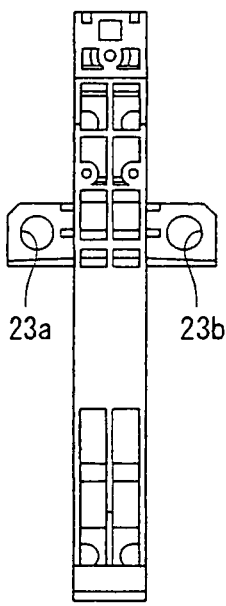 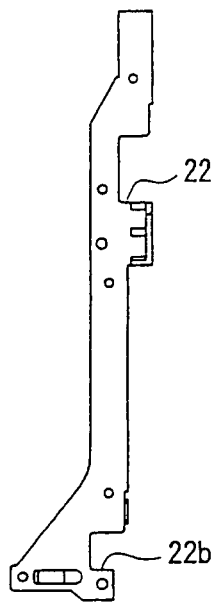 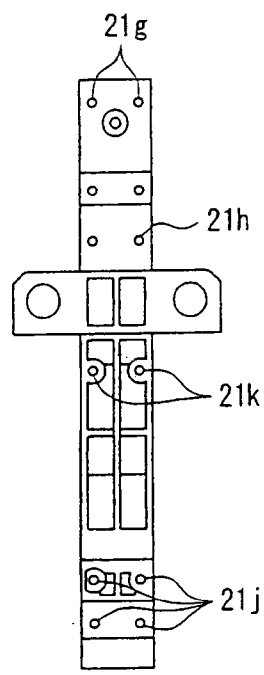
Fig. 5(a) Fig. 5(c) Fig. 5(e) Fig. 5(f)
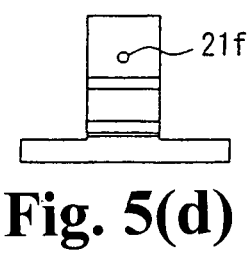
Fig. 5(d)
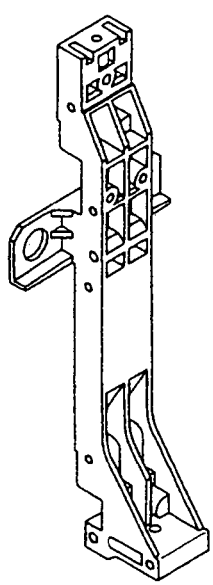 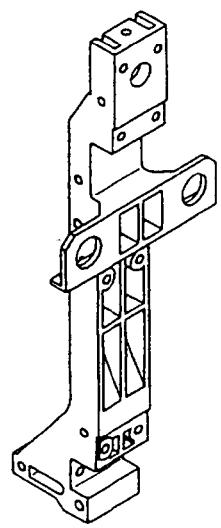
Fig. 5(g) Fig. 5(h)

PACKAGE STRUCTURE OF INVERTER APPARATUS AND METHOD OF MANUFACTURING THE SAME

BACKGROUND OF THE INVENTION AND RELATED ART STATEMENT

The present invention relates to a package structure of an inverter apparatus and a method of manufacturing the same, and more particularly to a package structure of an inverter apparatus and a method of manufacturing the same that can be suitably applied to increase the strength of the package structure.

Conventionally, metallic packages formed by combinations of aluminum die-cast members and metal sheets so as to support heavy components such as an electrolytic capacitor and a cooling fin have been used for inverter apparatuses.

FIG. 6 is an exploded perspective view showing a package structure of a conventional inverter apparatus, and FIG. 7 is an exploded perspective view showing the interior of the package structure of the conventional inverter apparatus.

As shown in FIG. 6, in the package structure of the inverter apparatus, aluminum die-cast members 101a and 101b having substantially the same length as the width of the inverter apparatus are provided in an upper part and a lower part, respectively. The upper and lower aluminum die-cast members 101a and 101b are connected to each other by side metal sheets 103a and 103b which constitute casings of both sides of the inverter apparatus, a frame metal sheet 106, and a rear plate 112.

A cooling fin 113 and an electrolytic capacitor 115 are mounted on the frame metal sheet 106, and a ceiling cover 102 is mounted on a ceiling surface of the inverter apparatus. It should be noted that the side metal sheets 103a and 103b, frame metal sheet 106, and rear plate 112 can be connected to the aluminum die-cast members 101a and 101b by screws.

As shown in FIG. 7, metal sheets on which built-in components such as a main circuit terminal block 110 and a printed-circuit board 111 are mounted on the side sheet-metals 103a and 103b and supporting sheet-metals mounted thereon.

For example, a method in which a front cover is placed on four supports with high strength for ventilating covers mounted on a ceiling surface and a bottom surface and is then secured to the supports by screws so as to reduce man-hours has been disclosed in Japanese Laid-Open Patent Publication (Kokai) No. 2005-243741.

In the package structure of the conventional inverter apparatus, however, the package strength of the inverter apparatus is secured by the upper and lower aluminum die-cast members 101a and 101b, side metal sheets 103a and 103b, and frame metal sheet 106. Thus, to install heavy components such as a cooling fin 113 and an electrolytic capacitor 115 in the early stage of assembly, the side metal sheets 103a and 103b are mounted on the aluminum die-cast members 101a and 101b in the early stage of assembly so as to secure s strength of the package, and therefore, there are some limitations as to tools for assembly.

Also, in the package structure of the conventional inverter apparatus, the aluminum die-cast members 101a and 101b having substantially the same length as the width of the inverter apparatus are used. Therefore, the shapes of the aluminum die-cast members 101a and 101b are limited by the width of the inverter apparatus. Thus, it is necessary to fabricate aluminum die-cast members 101a and 101b for each width of inverter apparatus, which significantly increases costs for manufacturing the aluminum die-cast members.

Further, since built-in components such as a main circuit terminal block 110 and a printed-circuit board 111 are mounted on the side metal sheets 103a and 103b which are substantially flat-shaped, there may be cases where built-in components, which are sometimes very fragile, are broken by resonance of the side metal sheets 103a and 103b. Accordingly, the package structure of the conventional inverter apparatus has to be reinforced by installing beams in transverse direction or the like.

An objective of the present invention is to provide a package structure of an inverter apparatus that can support heavy components without using side metal sheets, so that there is no limitation on the width of the inverter apparatus by the size of aluminum die-cast members.

Further objectives and advantages of the invention will be apparent from the following description of the invention.

SUMMARY OF THE INVENTION

To achieve the objective, a package structure of an inverter apparatus includes aluminum die-cast supports disposed at at least four corners of the inverter apparatus, and sheet-metal beams bent like a letter U with sharp bent edges, connecting the aluminum die-cast supports in the transverse direction and the longitudinal direction of the inverter apparatus.

With this arrangement, since the inverter apparatus can be supported by the aluminum die-cast supports and the sheet-metal beams, adequate package strength can be secured without using flat-shaped side metal sheets. Also, since the aluminum die-cast supports are connected in transverse direction by the sheet-metal beams, the width of the inverter apparatus can be defined by distances between the aluminum die-cast members, and therefore the width of the inverter apparatus can be adjusted without changing the size of the aluminum die-cast supports.

For this reason, the side metal sheets can be installed after the installation of heavy components such as a cooling fin and an electrolytic capacitor, and therefore, there is no limitation as to tools for assembly and assembling efficiency can be enhanced. Also, it is unnecessary to fabricate the aluminum die-cast supports for each of inverter widths, and therefore, it allows to avoid additional costs for manufacturing the inverter apparatus.

Preferably, the aluminum die-cast supports comprise metal sheet mounting tapped holes for fixing metal sheets, sheet-metal beam mounting notches for mounting sheet-metal beams, and unit hanging holes for hanging the inverter apparatus.

With this arrangement, the metal sheets can be mounted on the aluminum die-cast supports while securing the mounting locations precisely, and also adequate package strength can be secured while enhancing assembling efficiency.

Preferably, a main circuit terminal block and a printed-circuit board incorporated in the inverter apparatus are mounted on the sheet-metal beams connecting the aluminum die-cast supports in the longitudinal direction of the inverter apparatus.

With this arrangement, it is unnecessary to mount the main circuit terminal block and the printed-circuit board on the flat-shaped side metal sheets, and therefore, it is possible to prevent such built-in components, which are sometimes very fragile, from being broken by resonance of the side metal sheets.

To achieve the above objective, a method of fabricating a package structure of an inverter apparatus includes a step of connecting U-shaped sheet-metal beams with sharp bent edges to bases of aluminum die-cast supports, disposed at at least four corners of the inverter apparatus, in transverse direction of the inverter apparatus, a step of mounting ceiling covers and a bottom cover on the aluminum die-cast supports connected in transverse direction of the inverter apparatus, a step of connecting U-shaped sheet-metal beams to the aluminum die-cast supports in a longitudinal direction of the inverter apparatus, a step of mounting frame sheet-metals, on which an electrolytic capacitor and a cooling fin are to be mounted, to the aluminum die-cast supports to which the U-shaped sheet-metal beams are connected in the longitudinal direction of the inverter apparatus, a step of mounting a main circuit terminal block and a printed-circuit board on the U-shaped sheet-metal beams connected to the aluminum die-cast supports in the longitudinal direction of the inverter apparatus, and a step of mounting side metal sheets on the inverter apparatus after mounting the main circuit terminal block and the printed-circuit board on the U-shaped sheet-metal beams.

With this arrangement, since the side metal sheets can be mounted on the inverter apparatus after the installation of heavy components such as a cooling fin and an electrolytic capacitor, it makes it easier to access to the interior of the package and assemble the inverter apparatus. Also, the side metal sheets can be mounted on the inverter apparatus in the final step of assembly, so that damages to coating surfaces of the side metal sheets can be prevented.

The above and other objects, features, and advantages of the invention will become more apparent from the following detailed description taken in conjunction with the accompanying drawings.

BRIEF DESCRIPTION OF THE DRAWINGS

FIGS. 2(a) and 2(b) are exploded perspective views showing how to assemble aluminum die-cast supports according to an embodiment of the present invention, wherein FIG. 2(a) shows how to assemble aluminum die-cast supports on the ceiling cover side and sheet-metal beams in transverse direction, and FIG. 2(b) shows how to assemble the aluminum die-cast supports on the bottom cover side and sheet-metal beams in transverse direction;

FIGS. 5(a) to 5(h) are views showing the construction of an aluminum die-cast support according to the embodiment;

DETAILED DESCRIPTION OF THE PREFERRED EMBODIMENTS

A package structure of an inverter apparatus and a method of manufacturing the same according to an embodiment of the present invention will now be described with references to the drawings.

Figure 1:
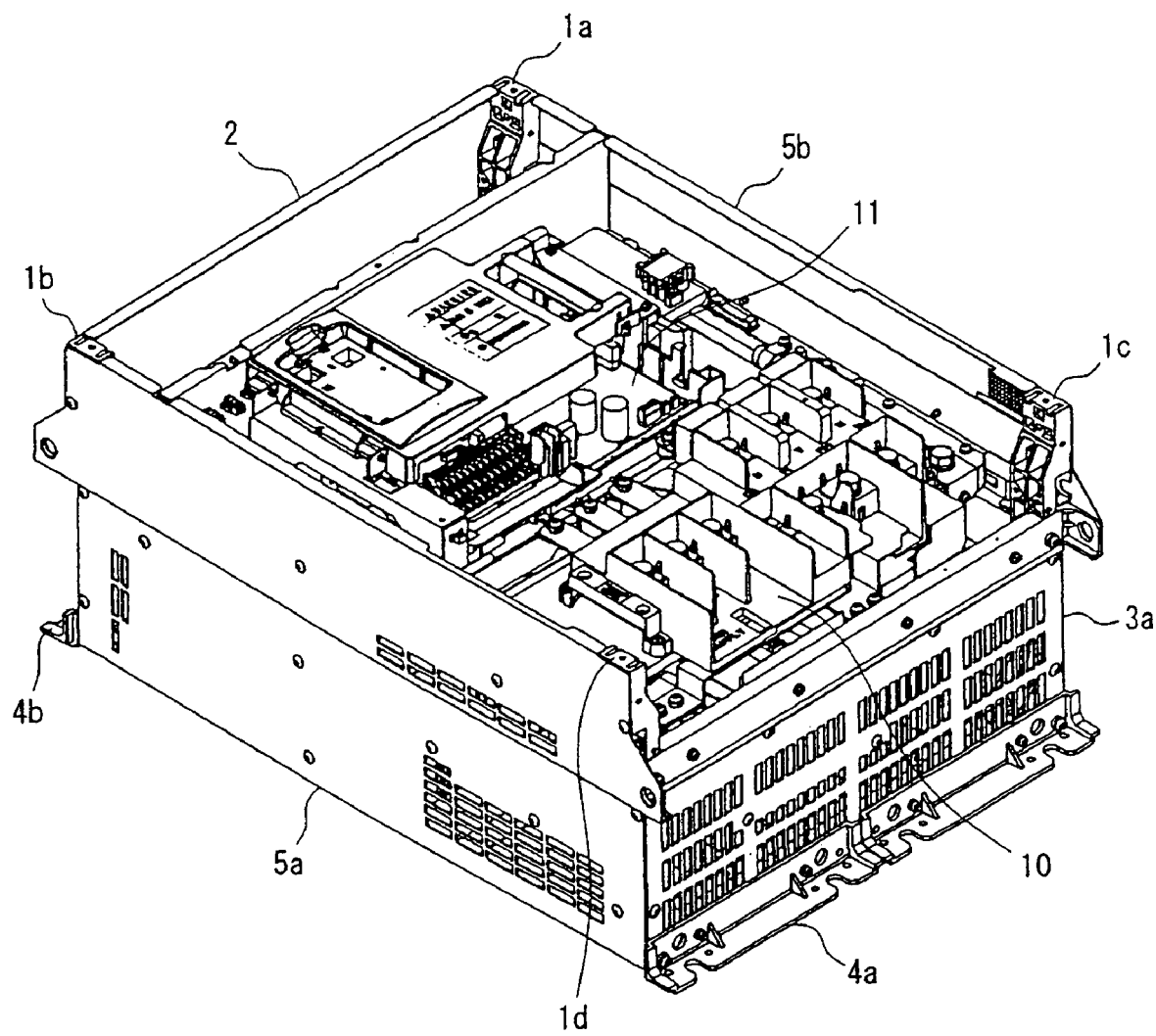
FIG. 1 is a perspective view showing a package structure of an inverter apparatus with a front cover removed according to an embodiment of the present invention.
Figure 2A:
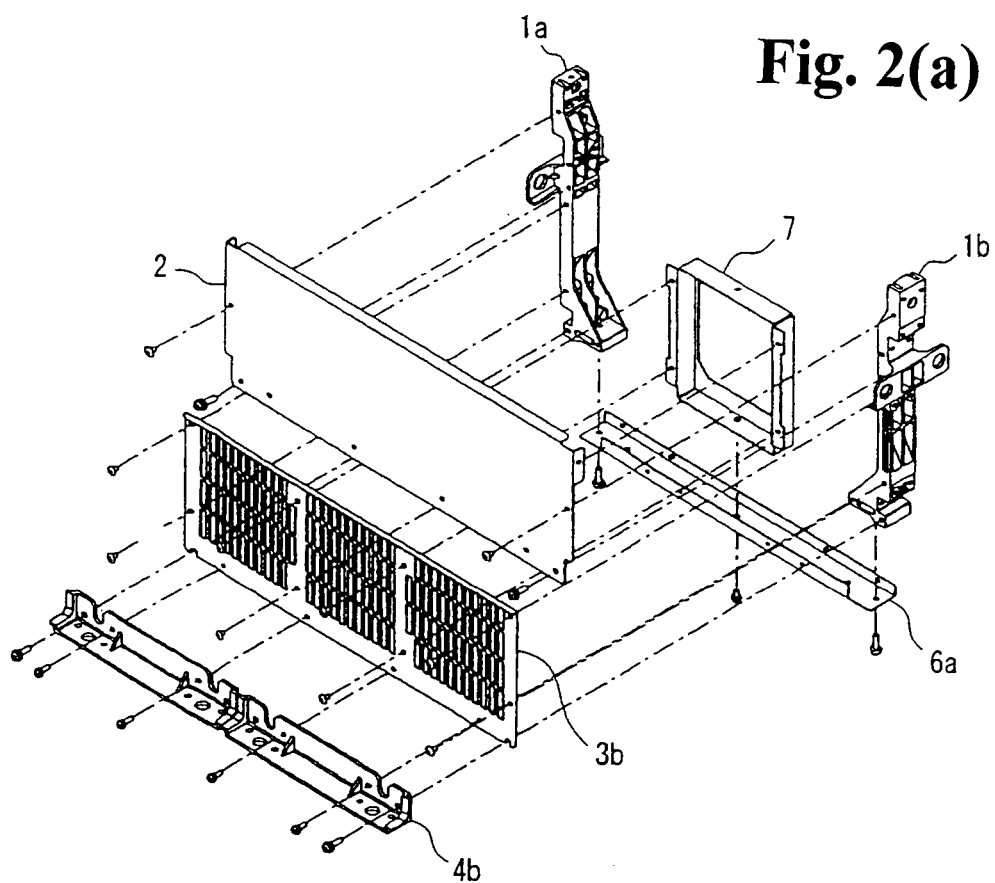
Figure 2B:
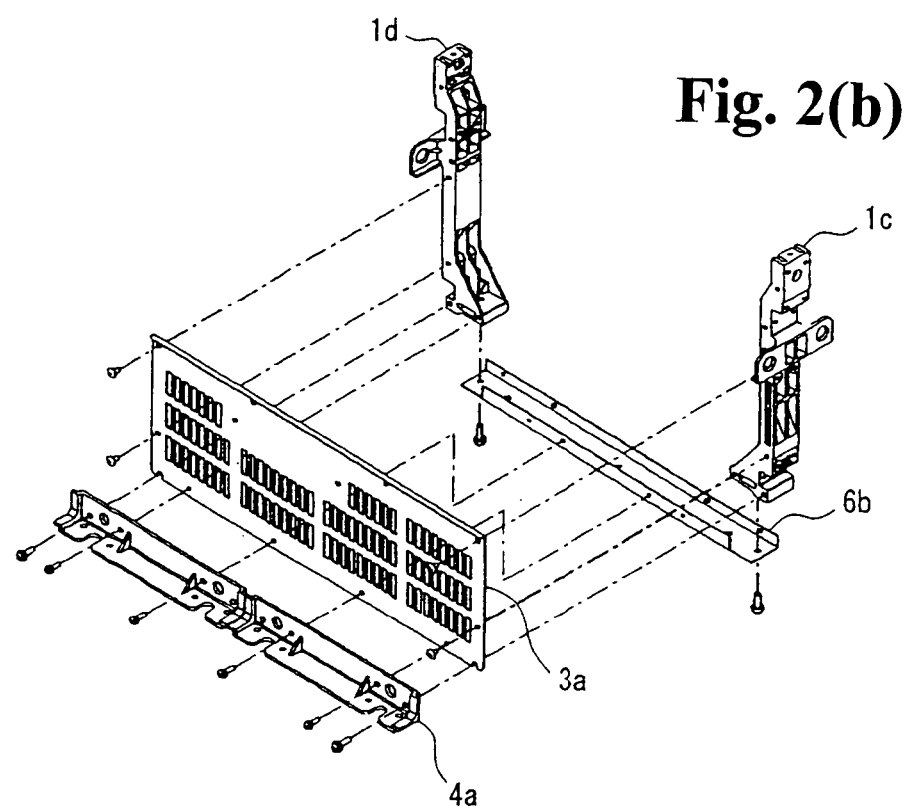
Figure 3A:
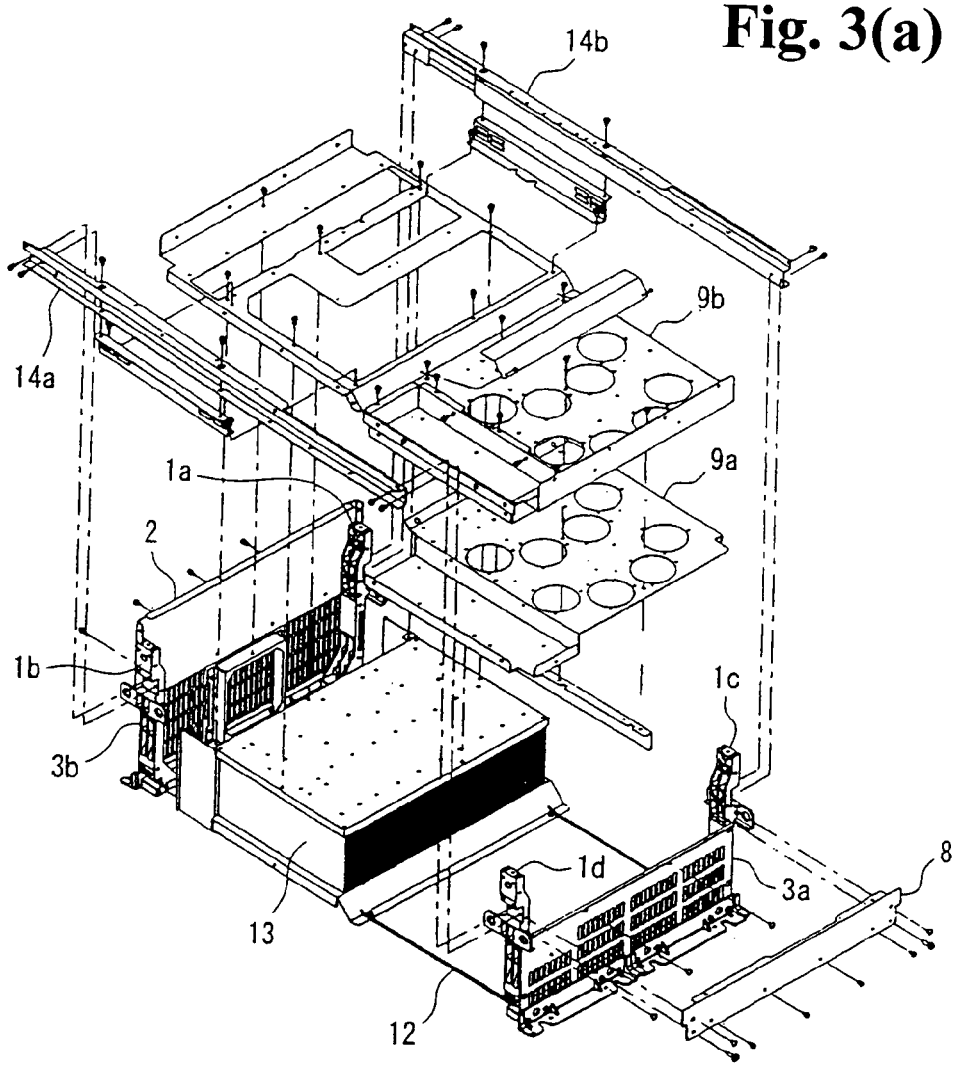
FIGS. 3(a) and 3(b) are exploded perspective views showing how to assemble aluminum die-cast supports and sheet-metal beams in longitudinal direction according to the embodiment.
Figure 3B:
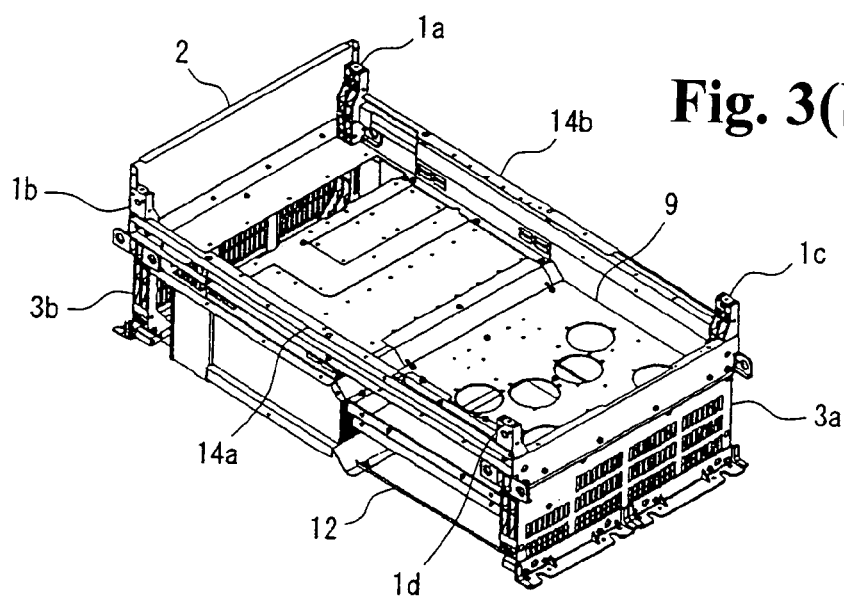
Figure 4:
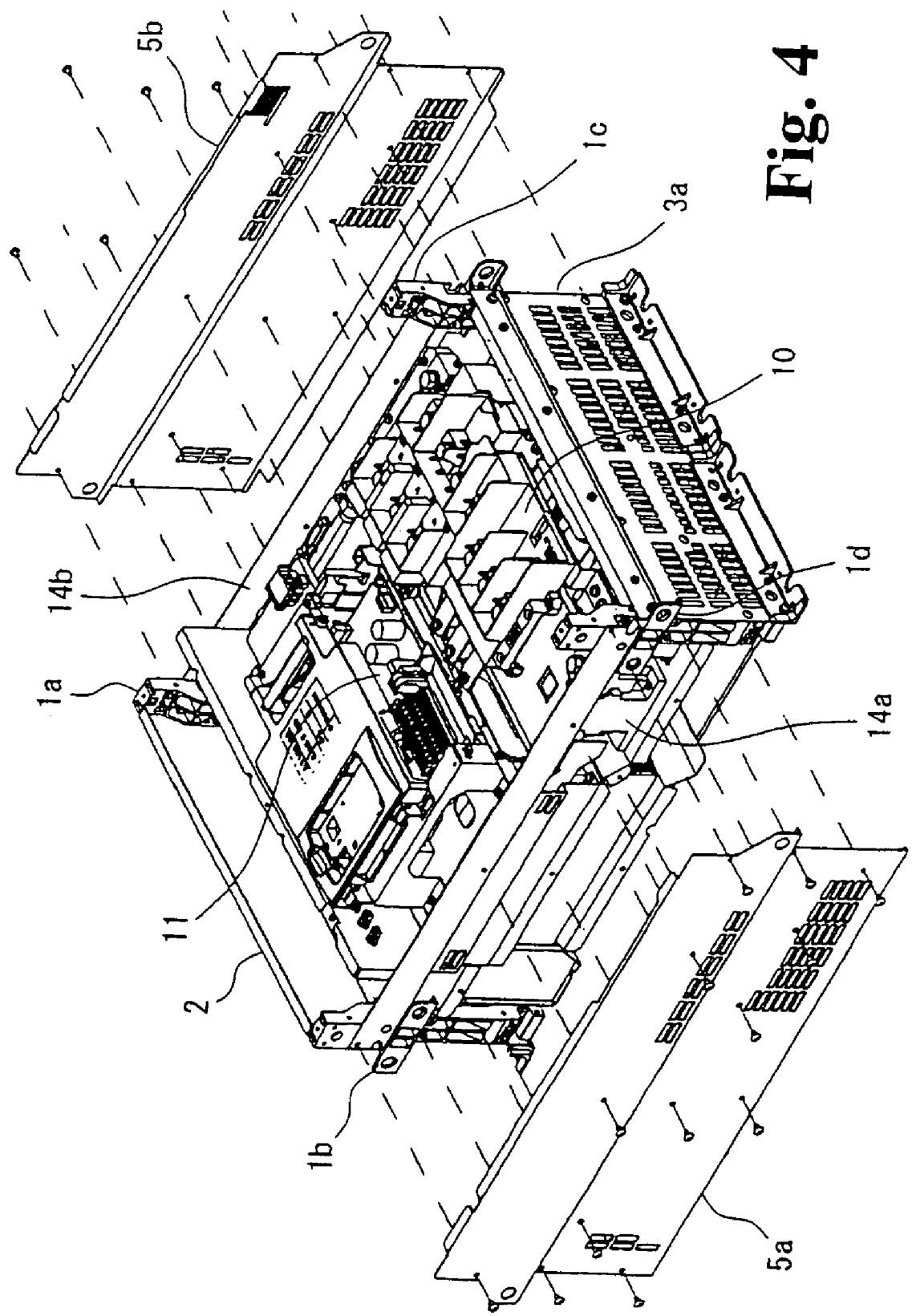
FIG. 4 is an exploded perspective view showing how to assemble side metal sheets in the inverter package structure according to the embodiment.
Figure 6:
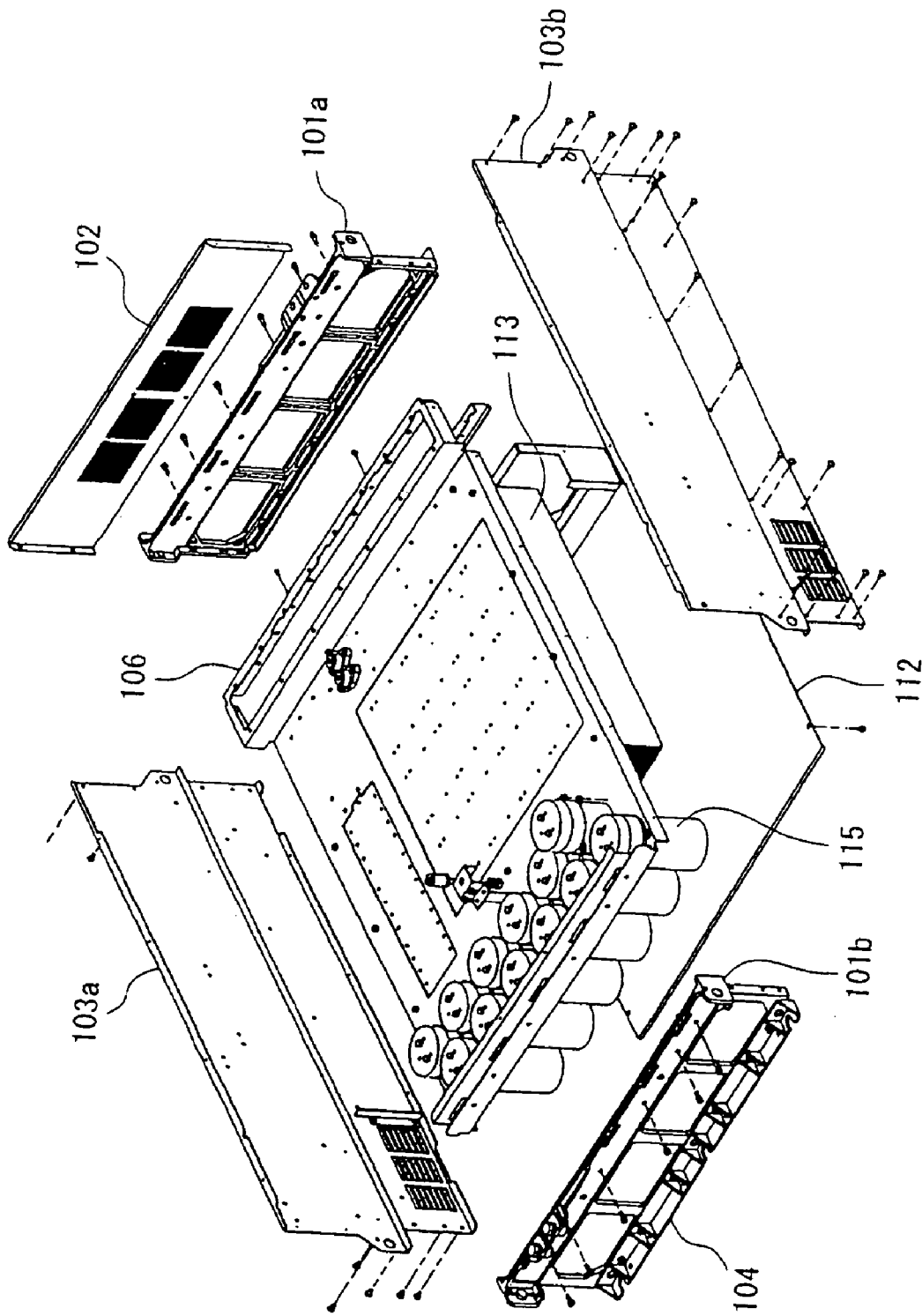
FIG. 6 is an exploded perspective view showing a package structure of a conventional inverter apparatus.
Figure 7:
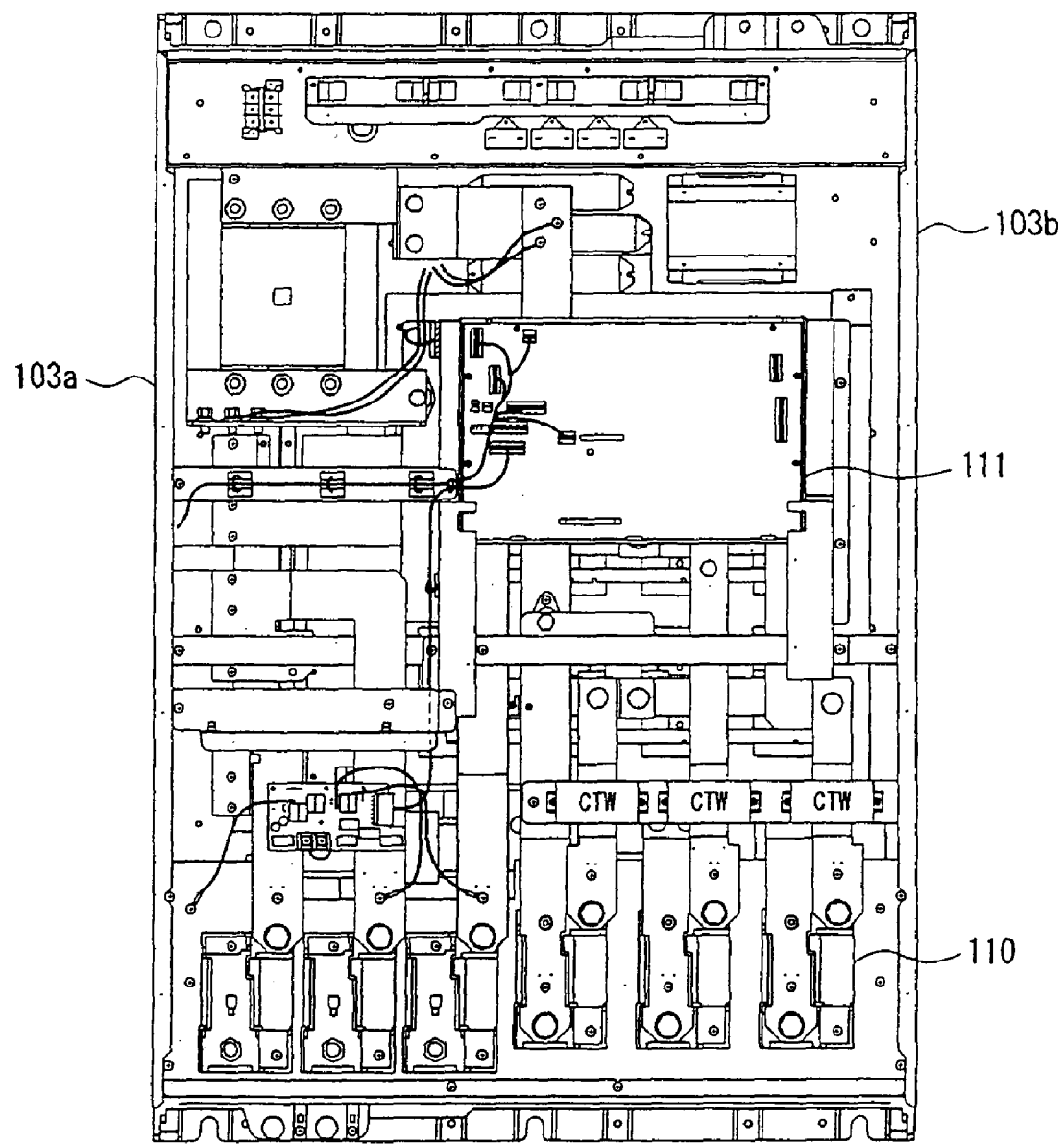
FIG. 7 is an exploded perspective view showing the interior of the package structure of the conventional inverter apparatus.

FIG. 1 is a perspective view showing a package structure of an inverter apparatus with a front cover removed according to an embodiment of the present invention. FIG. 2(a) is an exploded perspective view useful showing how to assemble aluminum die-cast supports on the ceiling cover side and sheet-metal beams in the transverse direction according to the embodiment. FIG. 2(b) is an exploded perspective view useful for showing how to assemble aluminum die-cast supports on the bottom cover side and sheet-metal beams in transverse direction according to the embodiment. FIG. 3(a) is an exploded perspective view useful for showing how to assemble aluminum die-cast supports and sheet-metal beams in longitudinal direction according to the embodiment. FIG. 3(b) is an exploded perspective view showing how to assemble aluminum die-cast supports and sheet-metal beams in longitudinal direction according to the embodiment. FIG. 4 is an exploded perspective view showing how to assemble side metal sheets in the inverter package structure according to the embodiment.

As shown in FIGS. 1 to 4, in the package structure of the inverter apparatus, aluminum die-cast supports 1a to 1d are disposed at four corners of the inverter apparatus. The aluminum die-cast supports 1a and 1b are connected to each other in transverse direction by a sheet-metal beam 6a bent like a letter U with sharp bent edges, and the aluminum die-cast supports 1c and 1d are connected to each other in transverse direction by a sheet-metal beam 6b bent like a letter U with sharp bent edges.

The aluminum die-cast supports 1b and 1d are connected to each other in the longitudinal direction by a sheet-metal beam 14a bent like a letter U with sharp bent edges, and the aluminum die-cast supports 1a and 1c are connected to each other in the longitudinal direction by a sheet-metal beam 14b bent like a letter U with sharp bent edges. Ceiling covers 2 and 3b are mounted on the aluminum die-cast supports 1a and 1b, and a bottom cover 3a is mounted on the aluminum die-cast supports 1c and 1d. A mounting foot 4a is mounted on the bottom cover 3a, and a mounting foot 4b is mounted on the ceiling cover 3b.

Frame metal sheets 9a and 9b on which an electrolytic capacitor and a cooling fin 13 are mounted are mounted on the aluminum die-cast supports 1a to 1d, and a main circuit terminal block 10 and a printed-circuit board 11 are mounted on the sheet-metal beams 14a and 14b. Further, side metal sheets 5a and 5b are mounted on respective sides of the inverter apparatus.

In constructing the package structure in FIG. 1, the aluminum die-cast supports 1a to 1d are disposed at respective four corners of the inverter apparatus as shown in FIG. 2. The sheet-metal beams 6a and 6b are mounted on the bases of the aluminum die-cast supports 1a to 1d by screws, and the aluminum die-cast supports 1a to 1d are connected to each other in the transverse direction of the inverter apparatus. By changing the length of the sheet-metal beams 6a and 6b, the width of the inverter apparatus can be arbitrarily changed.

The ceiling covers 2 and 3b and the bottom cover 3a are secured to the aluminum die-cast supports 1a to 1d, which are connected in the transverse direction, by screws. Also, a frame metal sheet 7 is secured to the ceiling cover 3b by screws. Further, the mounting foot 4a is secured to the bottom cover 3a by screws, and the mounting foot 4b is secured to the ceiling over 3b by screws.

Next, as shown in FIG. 3, the ceiling covers 2 and 3b and the bottom cover 3a are disposed in opposed relation in such a manner that the mounting foots 4a and 4b face outward. The sheet-metal beams 14a and 14b are then secured to the aluminum die-cast supports 1a to 1d by screws, so that the aluminum die-cast supports 1a to 1d are connected in the longitudinal direction of the inverter apparatus. By changing the lengths of the sheet-metal beams 14a and 14b, the longitudinal length of the inverter apparatus can be arbitrarily changed.

The frame metal sheets 9a and 9b are then secured to the aluminum die-cast supports 1a to 1d, which are connected in the longitudinal direction of the inverter apparatus by screws, and the electrolytic capacitor and the cooling fin 13 are mounted on the frame metal sheets 9a and 9b. A metal sheet 8 and a rear plate 12 are then secured to the aluminum die-cast supports 1a to 1d by screws.

Next, as shown in FIG. 4, the main circuit terminal block 10 and the printed-circuit board 11 are mounted on the sheet-metal beams 14a and 14b connected to the aluminum die-cast supports 1a to 1d, and thereafter, the side metal sheets 5a and 5a are secured to the aluminum die-cast supports 1a to 1d and the sheet-metal beams 14a and 14b by screws.

As a consequence, the aluminum die-cast supports 1a to 1d and the sheet-metal beams 6a, 6b, 14a, and 14b can support the inverter apparatus, and adequate package strength can be secured without using the flat-shaped side metal sheets 5a and 5b. Also, since the aluminum die-cast supports 1a to 1d are connected in transverse direction by the sheet-metal beams 6a and 6b, the width of the inverter apparatus can be defined by distances between the aluminum die-cast supports 1a to 1d, and therefore, the width of the inverter apparatus can be adjusted without changing the size of the aluminum die-cast supports 1a to 1d.

For this reason, the side metal sheets 5a and 5b can be installed after the installation of heavy components such as the cooling fin 13 and the electrolytic capacitor, and therefore, there is no more limitation as to tools used for assembly, and assembling efficiency can be enhanced. Also, it is unnecessary to fabricate the aluminum die-cast supports 1a to 1d for each of inverter widths, and therefore, the cost for manufacturing the inverter apparatus can be prevented from being increased.

FIGS. 5(a) to 5(h) are views showing the construction of each aluminum die-cast support according to the embodiment.

As shown in FIGS. 5(a)-5(h), the aluminum die-cast supports 1a to 1d are provided with sheet metal mounting tapped holes 21a to 21k, sheet-metal beam mounting notches 22a and 22b, and unit hanging holes 23a and 23b. On the other hand, the sheet-metal beams 6a, 6b, 14a, and 14b may be burred.

Metal sheets such as the sheet-metal beams 6a, 6b, 14a, and 14b and the frame metal sheets 9a and 9b are secured to the aluminum die-cast supports 1a to 1d by screws through the metal sheet mounting tapped holes 21a to 21k, and metal sheets such as sheet-metal beams 6a and 6b are fitted into the sheet-metal beam mounting notches 22a and 22b.

As a consequence, it is possible to mount the sheet metals on the aluminum die-cast supports 1a to 1d while securing the mounted locations adequately, and therefore, it is possible to obtain adequate package strength while enhancing assemble efficiency.

Although in the present embodiment, the aluminum die-cast supports 1a to 1d are disposed at four corners of the inverter apparatus, the present invention is not limited to this, but package strength can be further increased by increasing the number of supports, for example, additional aluminum die-cast supports may be provided in longitudinal direction of the inverter apparatus. That is, the number of aluminum die-cast supports can be determined depending on required package strength.

The disclosure of Japanese Patent Application No. 2006-140590 filed on May 19, 2006 is incorporated as a reference.

While the invention has been explained with reference to the specific embodiments of the invention, the explanation is illustrative and the invention is limited only by the appended claims.

What is claimed is:

1. A package structure of an inverter apparatus comprising:
   at least four metal column supports arranged vertically to be spaced apart from each other at corner portions, each of said metal column supports being an aluminum die-cast support, and comprising sheet-metal mounting tapped holes, sheet-metal beam mounting notches, and unit hanging holes; and
   sheet-metal bent beams connecting the column supports in transverse direction and longitudinal direction to form a rectangular package structure, each of said sheet-metal bent beams having a U-shape in cross section and being disposed in the sheet-metal beam mounting notches so that the sheet-metal bent beams are connected to the column supports by screws passing through holes of the sheet-metal bent beams and the sheet-metal mounting tapped holes to thereby form the rectangular package structure,
   wherein each of said column supports includes a vertical section having the sheet-metal mounting tapped holes and the sheet-metal beam mounting notches, and a lateral section crossing the vertical section to form a cross shape and having the unit hanging holes for hanging the inverter apparatus.

2. A package structure of an inverter apparatus according to claim 1, wherein the sheet-metal tapped holes are arranged to penetrate the column supports in two directions perpendicular to each other.

3. A package structure of an inverter apparatus according to claim 2, wherein each of the vertical sections includes two side walls, an intermediate wall, and a plurality of lateral walls connecting the two side walls and the intermediate wall.

* * * * *

UNITED STATES PATENT AND TRADEMARK OFFICE
CERTIFICATE OF CORRECTION

PATENT NO. : 7,715,198 B2  Page 1 of 1
APPLICATION NO. : 11/798820
DATED : May 11, 2010
INVENTOR(S) : Kazuaki Mori et al.

It is certified that error appears in the above-identified patent and that said Letters Patent is hereby corrected as shown below:

Title page, Item (73) the assignee, "Fuji Electric FA Components & Systems Co., Ltd." to
-- Fuji Electric Systems Co., Ltd. --.

Signed and Sealed this

Thirty-first Day of August, 2010

David J. Kappos
*Director of the United States Patent and Trademark Office*